United States Patent [19]

Wada et al.

[11] Patent Number: 6,138,257
[45] Date of Patent: Oct. 24, 2000

[54] IC TESTING APPARATUS AND METHOD

[75] Inventors: Yuji Wada; Kaoru Fukuda, both of Kodama-gun; Yoshio Kamiko, Kitasaku-gun; Masaaki Mochiduki, Honjo, all of Japan

[73] Assignee: Hitachi Electronics Engineering Co., Ltd., Japan

[21] Appl. No.: 09/115,793

[22] Filed: Jul. 15, 1998

[30] Foreign Application Priority Data

Jul. 24, 1997 [JP] Japan ..................................... 9-214156

[51] Int. Cl.[7] ............................ G01R 31/28; G06F 11/00
[52] U.S. Cl. ........................................... 714/724; 714/738
[58] Field of Search ................................... 714/710, 724, 714/733, 734, 718, 723, 738, 742, 739, 741; 711/202

[56] References Cited

U.S. PATENT DOCUMENTS 5,381,417  1/1995  Loopik et al. ........................... 714/724
5,790,565  8/1998  Sakaguchi ............................... 714/738

Primary Examiner—Christine Trinh L. Tu
Attorney, Agent, or Firm—Morrison & Foerster

[57] ABSTRACT

Main tester unit tests an IC device for presence of a defect for each of a plurality of addresses of the IC device under predetermined test conditions and stores test results for the individual addresses into a first memory. Curing analysis processing section cures each of the addresses of the IC device determined as defective, on the basis of the test results for the individual addresses stored in the first memory. To this end, the curing analysis processing section may rearrange an address logic of the IC device to replace a physical space of the defective addresses with an extra or redundant address space and thereby place each of the defective addresses in a usable condition. In parallel with the operations by the curing analysis processing section, a defect analysis section acquires, from the main tester unit, the test results for the individual addresses along with data indicative of the predetermined test conditions for storage into a second memory, and analyzes a specific cause of the defect in the IC device on the basis of the stored data in the second memory. With this arrangement, it is possible to acquire information necessary for analyzing the defect in the IC during a curability determining analysis test on a mass production line and thereby can effectively analyze the specific cause of the detected defect.

8 Claims, 3 Drawing Sheets

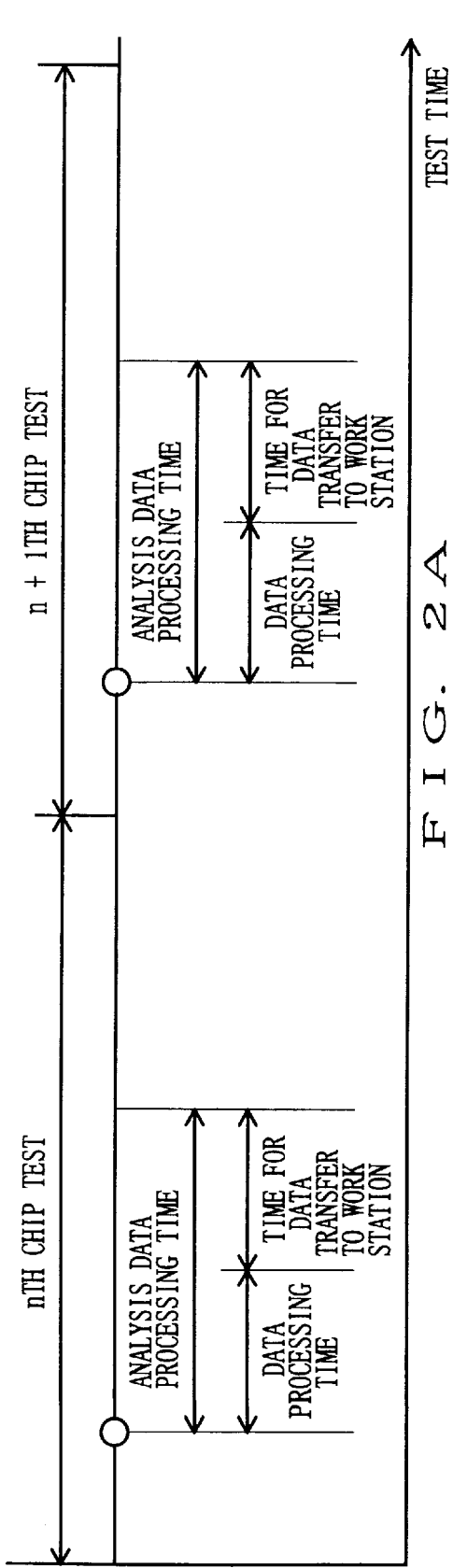
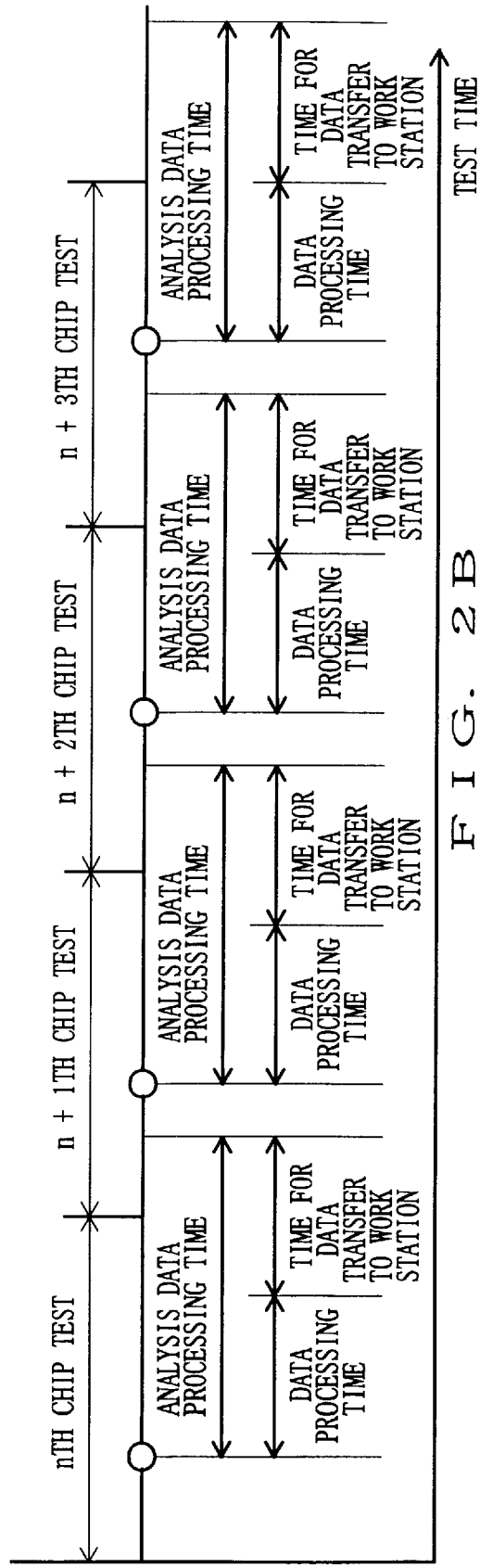

IC TESTING APPARATUS AND METHOD

BACKGROUND OF THE INVENTION

The present invention relates generally to apparatuses and methods for testing electrical characteristics of IC (Integrated Circuit) devices, and more particularly to an improved IC testing apparatus and method that are capable of analyzing a specific cause of a failure or defect in each IC. It should be obvious that the term "IC" as used herein also refers to an LSI (Large-Scale Integrated circuit).

To ship mass-produced IC devices as final, finished products of guaranteed performance and quality, it is absolutely necessary to inspect electrical characteristics of all or some of the IC devices at individual stages of manufacturing and testing stations.

Various IC testing apparatuses have been widely known, which are designed to test electrical characteristics of ICs. For testing the electrical characteristics, the known IC testing apparatuses, in general, first feed predetermined test patten data to each IC to be tested and then reads out data, output from the IC in response to the fed test patten data, to determine therefrom whether or not the IC has any trouble with its basic behavior and function.

More specifically, in the "function test" performed by the known IC testing apparatuses, predetermined test patten data are first fed from a pattern generating section to the input terminals of each IC to be tested, and data output from the IC in response to the test patten data are then read and examined to determine whether or not the IC has any trouble with its basic behavior and function. Namely, the function test is intended to check output timing, output amplitudes, etc. of the IC, by varying input timing and amplitudes, etc. of various signals and data, such as address, data, write-enable signal and chip-select signal, to be fed to the IC.

Where the IC device to be tested is a memory, the IC testing method typically feeds address data and test pattern data to the IC so that the test pattern data are written in the IC at various addresses designated by the address data. Then, the same address data are again given to the IC to read out the data from the same addresses to check whether or not the read-out data match the test pattern data previously written as "expected value" data. After that, test results, each of which is a one-bit data of logical value "0" or "1" representing a "pass" (i.e., a successful result in the test) or "fail" (i.e., an unsuccessful result in the test), are recorded at individual addresses of a fail bit memory corresponding to an address map of the IC. In this way, test result data of logical values "0" and "1" representing a "pass" and "fail" are mapped to the corresponding addresses in the fail bit memory corresponding to the IC's address map.

The "pass/fail" pattern data thus stored in the fail bit memory are utilized for further IC analysis tests depending on an intended purpose. Normally, such IC analysis tests typically include a curability determining analysis test and defect analysis test.

In an attempt to correct or cure failed or defective bits of the IC, the curability determining analysis test is designed to map the failed-bit area of the IC to an address space of the fail bit memory during the course of the actual test of the IC's electric characteristics. Immediately after the mapping, the stored data are read out from the fail bit memory in order to substitutively allocate addresses, associated with the failed bits, to redundant lines in the IC. Specifically, this curability determining analysis test is conducted, on the IC mass production line or process, to determine whether the tested IC is "indefective" or "defective" and whether the IC, if determined as defective, is curable or not, and then actually cures the failed bits on the basis of the determination results.

Note that the term "cure" as used herein refers to rearranging the address input logic of the IC in such a manner that a physical space of given addresses having determined as "defective" or "failed" is replaced by an extra (redundant) physical space and thereby placing all the defective addresses of the IC in a usable condition. If the number of failed or defective addresses is smaller than the number of usable addresses in the extra (redundant) physical space, then the IC in question will be determined as "curable", but if the number of failed or defective addresses is greater than the number of usable addresses in the extra physical space, the IC will be determined as "incurable". The above-mentioned curability determining analysis test operates to not allocate the usable addresses to the IC's defective area while allowing the usable addresses to be allocated only to its indefective area; thus each IC with some defective area can be cured into an acceptable IC and an enhanced yield of ICs is achieved. Therefore, it is desired that such a curability determining analysis test be carried out with top priority on the IC mass production line. Generally, the curability determining analysis test is performed on the IC mass production line for every manufactured IC.

On the other hand, the defect analysis test is designed to analyzing a specific cause of a failure or defect in the IC as well as mapping a failed-bit area to an address space in the fail bit memory. For these purposes, the defect analysis test uses the stored contents of the fail bit memory but also various test parameters such as address data and test pattern data used in the pass/fail test and would take a considerable amount of time. Through this defect analysis test, it is possible to ascertain details of a defect, such as whether the defect is present at a particular tiny spot or a relatively extensive area on the surface of the IC or in the shape of a horizontal or vertical narrow line. Thus, the defect analysis test can be useful for identification of a specific cause of a detected failure or defect, quality control and management of various production stages.

In some cases, such defect analysis test is performed off the mass production line extractively for selected ones of the manufactured ICs rather than on the mass production line for every manufactured IC, but such an extractive defect analysis test is not desirable from a viewpoint of quality control. Namely, from the viewpoint of quality control, it is preferred to perform the defect analysis test for every manufactured IC, which would, however, present the problem that a longer test time is required. However, because the curability determining analysis test and defect analysis test are performed separately, execution of the two tests would result in each test cycle taking a longer time, thus leading to low IC-mass production efficiency. In addition, because the curability determining analysis test and defect analysis test are carried out using completely separate testing apparatuses, the conventional approach would require relatively high costs.

In particular, for satisfactory defect analysis, it is necessary to analyze an entire semiconductor wafer from which the IC chip in question is produced, rather than that IC chip alone; to this end, in the defect analysis test, it is necessary to accumulate fail data on every IC chip produced from a same IC chip. For example, in a situation where hundreds of IC chips are formed on a single semiconductor wafer, data to be accumulated for this purpose would amount to a huge quantity; in this case, acquiring the huge quantity of data alone would take an enormous amount of time and subsequently analyzing the acquired data would take an additional enormous amount of time. As a result, the poor efficiency of the conventional approach would present an even more serious problem.

SUMMARY OF THE INVENTION

It is therefore an object of the present invention to provide an IC testing apparatus and method which can acquire information for analyzing a defect of an IC while simultaneously performing a test (curability determining analysis test) on an IC mass production line, and thereby can analyze a specific cause of a defect in the IC concurrently with the test.

According an aspect of the present invention, there is provided an IC testing apparatus which comprises: a main tester unit that tests an IC device for presence of a defect for each of a plurality of addresses thereof under predetermined test conditions and stores test results for individual ones of the addresses into a first memory; a curing analysis processing section that cures each of the addresses of the IC device determined as defective on the basis of the test results for the individual addresses stored in the first memory; and a defect analysis section that acquires, from the main tester unit, the test results for the individual addresses along with test condition data indicative of the predetermined test conditions to store the test results and the test condition data into a second memory, and analyzes a specific cause of a defect in the IC device on the basis of the test results for the individual addresses and the test condition data stored in the second memory.

According to the present invention, the main tester unit performs a determination on quality (acceptability of electrical characteristics), i.e., a well-known pass/fail test, for each of the addresses of an IC device, to ascertain presence/absence of a defect for each of the addresses. The pass/fail test results for the individual addresses are stored into the first memory or fail bit memory in a bit-map format. The curing analysis processing section cures each of the addresses of the IC device determined as defective. To this end, the curing analysis processing section identifies defective addresses on the basis of the pass/fail test results mapped in the first or fail bit memory and then rearranges the address logic of the IC device to replace a physical space of the defective addresses with an extra or redundant address space and thereby place the defective addresses in a usable condition. The IC testing apparatus also includes a defect analysis section to perform defect analysis of the IC device concurrently with, i.e., in parallel with the operations by the main tester unit and curing analysis processing section. Specifically, this defect analysis section acquires, from the main tester unit, the test results for the individual addresses along with test condition data indicative of the predetermined test conditions for storage into the second memory provided in the analysis section. Then, on the basis of the test results and the test condition data thus stored in the second memory, the defect analysis section analyzes a specific cause of the defect in the IC device. Thus, a defect analysis test can be performed by the defect analysis section during the time that the pass/fail test and curability determining analysis test are carried out by the main tester unit and curing analysis processing section on an IC mass production line. At that time, the results of each pass/fail test by the main tester unit can be utilized for both the curability determining analysis test and the defect analysis test, which achieves greatly enhanced efficiency; that is, there is no need to perform a separate quality test for defect analysis and hence the total test time can be shortened to a significant degree. In addition, with the arrangement that the defect analysis test is performed concurrently with the curability determining analysis test, the IC mass production can progress without a need to wait for progression of the defect analysis test and without adversely affecting the operating efficiency of the mass production line.

The principle of the present invention can also be embodied as a method invention. Namely, the present invention provides an IC testing method which comprises: a first step of, at a particular stage of an IC device production process testing an IC device for presence of a defect for each of a plurality of addresses thereof under predetermined test conditions and storing test results for individual ones of the addresses into a first memory; a second step of curing each of the addresses of the IC device determined as defective on the basis of the test results for the individual addresses stored in the first memory; a third step of, in response to testing of the IC device by the first step, acquiring the test results for the individual addresses along with test condition data indicative of the predetermined test conditions to store the test results and the test condition data into a second memory; and a fourth step of analyzing a specific cause of a defect in the IC device on the basis of the test results for the individual addresses and the test condition data stored in the second memory, in parallel with operations of the first and second steps.

The principle of the present invention can also be implemented as a recording medium storing a program executable by a computer or by one or more CPUs for carrying out such an IC testing method.

BRIEF DESCRIPTION OF THE DRAWINGS

For better understanding of the above and other features of the present invention, the preferred embodiments of the invention will be described in greater detail below with reference the accompanying drawings, in which:

FIGS. 2A an 2B are time charts showing two examples of behavior of the IC testing apparatus of FIG. 1; FIG. 2A shows a case where the apparatus performs the curability determining analysis test and defect analysis test at different timing and FIG. 2B shows a case where the apparatus simultaneously performs the curability determining analysis test and defect analysis test.

DETAILED DESCRIPTION OF THE PREFERRED EMBODIMENTS

Figure 1:
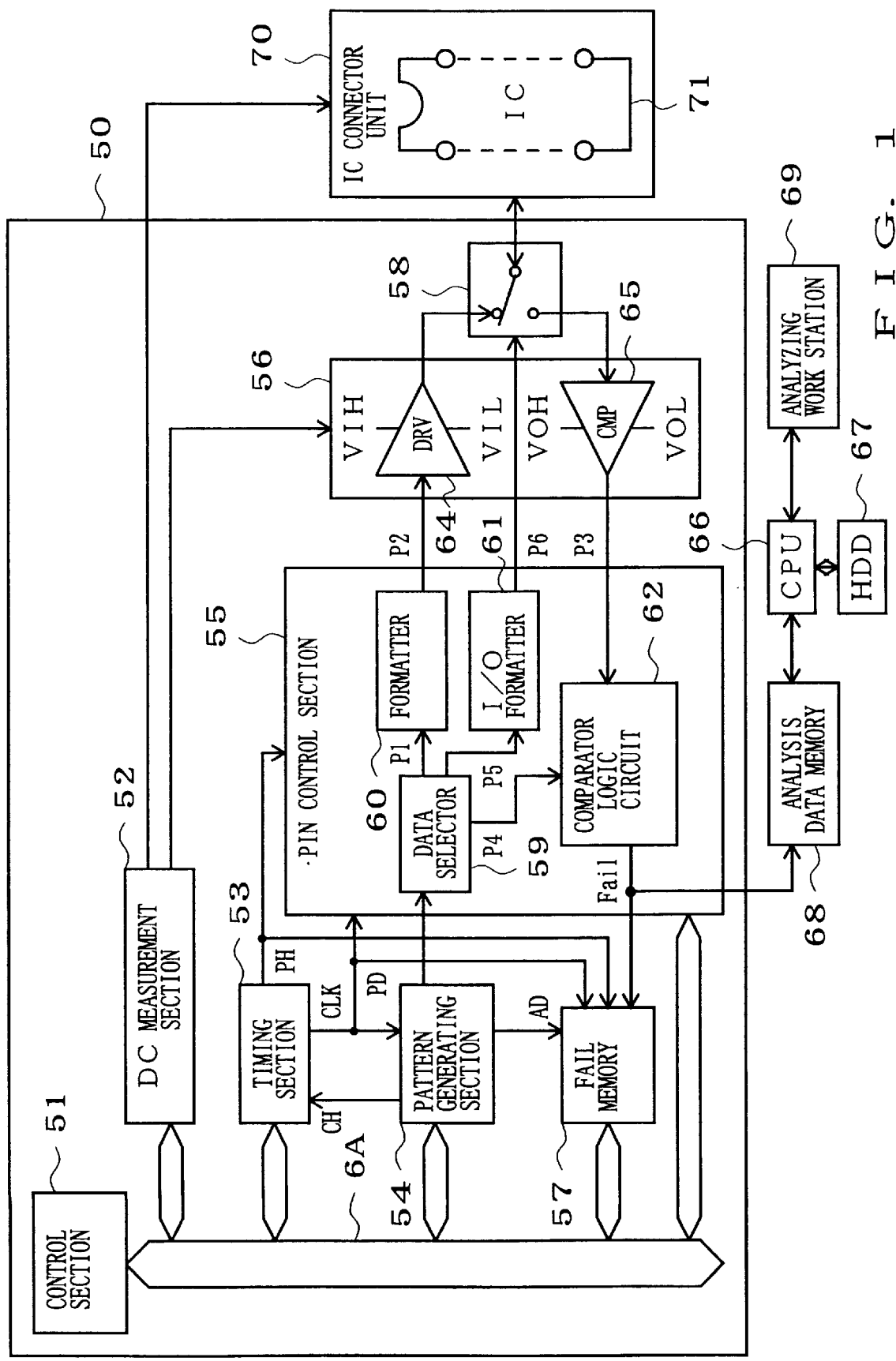
FIG. 1 is a block diagram illustrating a detailed overall setup of an IC testing apparatus in accordance with a preferred embodiment of the present invention, which can simultaneously perform a curability determining analysis test and defect analysis test of an IC on an IC mass production line.

FIG. 1 is a block diagram illustrating a detailed overall setup of an IC testing apparatus in accordance with a preferred embodiment of the present invention, which is capable of simultaneously performing a curability determining analysis test and defect analysis test of each IC device manufactured on an IC mass production line.

As shown, the IC testing apparatus generally comprises a tester unit 50 and an IC connector unit 70. The tester unit 50 includes a control section 51, a DC (Direct Current) measurement section 52, a timing section 53, a pattern generating section 54, a pin control section 55, a pin electronics 56, a fail memory 57 and an input/output switching section 58. The tester unit 50 also includes various other components, although they are neither shown nor described herein since they are not essential to the present invention.

The control section 51 comprises a microprocessor, which controls and manages overall operations of the IC testing apparatus. Thus, although not specifically shown, the control section 51 includes a ROM for storing system programs and a RAM for storing various data. Via a tester bus (a combination of data, address and control buses) 6A, the control section 51 is connected with the DC measurement section 52, timing section 53, pattern generating section 54, pin control section 55 and fail memory 57.

The control section 51 provides the DC measurement section 52 with DC test data, provides the timing section 53 with timing data to initiate a function test, and also provides the pattern generating section 54 with a program and data necessary for generating a test pattern. Also, the control section 51 outputs various other data to the respective components via the tester bus 6A.

The timing section 53 stores the timing data, received from the control section 51, into its internal memory. On the basis of the received timing data, the timing section 53 provides the pattern generating section 54, pin control section 55 and fail memory 57 with high-speed clock pulses CLK and provides a read timing signal PH to the pin control section 55 and fail memory 57. Thus, the operating speeds of the pattern generating section 54, pin control section 55 and fail memory 57 are governed by the clock pulses CLK from the timing section 53, and the timing to write and read data to and from the IC 71 to be tested is determined by the timing signals PH. Output timing of a test signal P2 to be passed from a formatter 60 to the pin electronics 56 and a switching signal P6 to be passed from an I/O formatter 61 to the input/output switching section 58 is controlled on the basis of the timing signal PH from the timing section 53. In response to a timing switching control signal CH received from the pattern generating section 54, the timing section 53 operates to vary the operational cycle and phase of the tester unit 50 as necessary.

The pattern generating section 54 receives from the control section 51 data necessary for generating a test pattern (microprograms and pattern data) and then provides a data selector 59 of the pin control section 55 with pattern data PD based on the received data. Specifically, the pattern generating section 54 operates either in a programmed mode where it outputs regular test pattern data through various arithmetic operations based on the microprograms, or in a memory stored mode where it previously stores, into a predetermined internal memory (which will hereinafter called a "pattern memory"), data to be written into the IC and then reads out the stored data using same addresses as those of the IC to thereby output irregular or random pattern data (expected value data).

The pin control section 55 includes, in addition to the above-mentioned data selector 59 and formatter 60, an I/O formatter 61 and a comparator logic circuit 62.

The data selector 59 of the pin control section 55 comprises a memory having stored therein various test signal creating data (address data and to-be-written data) P1, switching signal creating data P5 and expected value data P4. The data selector 59 receives the pattern data from the pattern generating section 54 as an address, so that it provides the test signal creating data P1, switching signal creating data P5 and expected value data P4, corresponding to the address, to the formatter 60, I/O formatter 61 and comparator logic circuit 62, respectively.

In synchronism with the timing signal PH from the timing section 53, the formatter 60 processes the test signal creating data (address data and to-be-written data) P1 supplied from the data selector 59 to thereby create a predetermined waveform and feeds the created waveform to the pin electronics 56 as the test signal P2.

The I/O formatter 61, in synchronism with the timing signal PH from the timing section 53, processes the switching signal creating data P5 from the data selector 59 to thereby create a predetermined waveform and feeds the created waveform to the input/output switching section 58 as the switching signal P6.

The comparator logic circuit 62 compares an output P3 from an analog comparator 65 of the pin electronics 56 and the expected value data P4 from the data selector 59 and then provides the fail memory 57 with pass/fail pattern data Fail that is indicative of the comparison result. The fail memory 57, which corresponds to the fail bit memory as described earlier in relation to the conventional techniques, is provided for storing data indicating whether the comparator logic circuit 62 has determined the IC as "failed" the function test or not (i.e., whether the IC is defective or indefective); such data are stored on an address-by-address basis in a bit-map format.

Further, the pin electronics 56 comprises a plurality of drivers 64 and analog comparators 65. The analog comparators 65 are provided in corresponding relation to the input/output terminals of the I/C connector 70, one for each input/output terminal. Either the drivers 64 or the analog comparators 65 are connected to given ones of the input/output terminals of the I/C connector 70 via the input/output switching section 58. Specifically, in response to the switching signal P6 from the I/O formatter 61, the input/output switching section 58 switches connection between one of the drivers 64 and analog comparators 65 and the input/output terminals of the I/C connector 70.

Via the input/output switching section 58, the drivers 64 feed signals, of levels corresponding to the test signal P2 from the formatter 60 of the pin control signal 55, to the input/output terminals of the I/C connector unit 70 and hence signal input terminals, such as address, data, chip-select, write-enable terminals, of the IC 71, to thereby write a desired test pattern into the IC 71.

Each of the analog comparators 65 receives a signal output from the data output terminal of the IC 71 via the input/output switching section 58 and compares the received signal with reference voltages VOH and VOL, so that the comparator 65 outputs the comparison result to the comparator logic circuit 62 as read-out data P3. Whereas a pair of the analog comparators 65 are normally provided for the two reference voltages VOH and VOL in relation to each of the data output terminals of the IC 71, only one of the analog comparators 65 is shown in FIG. 1.

In synchronism with the high-speed clock pulses generated from the timing section 53, the fail memory 57 stores pass/fail pattern data Fail from the comparator logic circuit 62 at its address location corresponding to the address signal AD from the pattern generating section 54. When the tested IC 71 has been determined as "failed" or "defective", the fail memory 57 is used for detailed analysis of any possible defective point or region of the IC 71. The pass/fail pattern data Fail thus stored in the fail memory 57 are read out by the control section 51 to undergo a predetermined curability determining analysis test. Note that the curability determining analysis test may be performed either by the control section 51 or by a separate data processing apparatus (not shown).

For execution of a defect analysis test as described earlier in relation to the conventional techniques, the IC testing apparatus of FIG. 1 further includes an analysis data acquiring unit that is composed of an analysis data memory section 68, a CPU 66 and a hard disk drive (HDD) 67. The IC testing apparatus further includes an analyzing work station 69 that analyzes any deficiency or failure of the IC 71 on the basis of the analysis data acquired via the analysis data acquiring unit.

Into the analysis data memory section 68 provided in parallel with the fail memory 57 of the main tester unit 50, the analysis data acquiring unit stores the pass/fail pattern data Fail having been obtained for the curability determining analysis test, as well as various other data to be used for the defect analysis test. Specifically, under predetermined test conditions such as a predetermined test speed and test pattern, the analysis data memory section 68 acquires not only the pass/fail pattern data Fail given from the comparator logic circuit 62 but also a program count PC, an address PGAD passed from the pattern generating section 54 to the IC to be tested, expected value data ExpData that will be output from the IC 71, etc. The analysis data memory section 68 has a storage capacity equal to or greater than that of the fail memory 57, so as to provide for acquisition of a great number of simultaneously measured data in testing a multiplicity of mass-produced ICs.

After the analysis data are acquired in the analysis data memory section 68 during the tests of mass-produced ICs, the CPU 66 disconnects the memory section 68 from the comparator logic circuit 62. Then, the CPU 66 stores the analysis data, accumulated in the memory section 68, into the hard disk 67 in file form and also transfers the analysis data to the analyzing work station 69. Specifically, the CPU 66 files the analysis data, acquired in the analysis data memory section 68, within a short length of time and transfers the thus-filed data to the analyzing work station 69; the CPU 66 operates to complete these data filing and transfer operations before analysis data on a next IC device are acquired.

With such an arrangement, the analysis data can be acquired without reducing throughput during execution of the tests of the mass-produced ICs. Further, because the fail memory 57 can be used exclusively for the curability determining analysis test, it is possible to eliminate a need for reserving a great storage capacity more than necessary and also to minimize various time-related requirements. Furthermore, because data of the entire semiconductor wafer can be stored in the analysis data memory section 68, a detailed defect analysis can be performed on a wafer-by-wafer basis. In addition, storing data in the analysis data memory section 68 on a lot-by-lot basis will permit a detailed defect analysis of each of the lots and will also be useful for enhanced yield. Whereas the conventional IC testing apparatuses are intended mainly for testing ICs, the IC testing apparatus can be used effectively to develop new ICs and also can shorten the necessary time for the development.

Now, behavior of the IC testing apparatus of the embodiment will be described with reference to timing charts of FIGS. 2A and 2B; specifically, FIG. 2A shows exemplary behavior of the conventional IC testing apparatus where the curability determining analysis test and defect analysis test are performed at different timing, while FIG. 2B shows exemplary behavior of the IC testing apparatus of the present invention where the curability determining analysis test and defect analysis test are performed simultaneously.

In the case of FIG. 2A where the curability determining analysis test and defect analysis test are performed by the same IC testing apparatus at different timing, a necessary time for each chip test equals a sum of times required for the two tests, which will thus never lead to a significant reduction in the total necessary test time. However, in this case, the IC testing apparatus need not be exchanged with a failure analyzing apparatus each time the defect analysis is to be performed, and absence of such an exchanging time can contribute to reduction in the total test time.

On the other hand, in the case of FIG. 2B where the curability determining analysis test and defect analysis test are performed by the same IC testing apparatus simultaneously in parallel with each other, the necessary time for each chip test can be halved, which therefore makes it possible to perform the chip test virtually twice as fast as in the case of FIG. 2A. Although the total time from a start of the analysis data acquiring test to a point when transfer of the analysis data to the analyzing work station 69 is completed, i.e., the analysis data processing time, is the same for the case of FIG. 2A and the case of 2B, the latter case can substantially advance or bring forward a start point of a next analysis data acquiring test and consequently enhance the overall test throughput to a significant degree.

Figure 3:
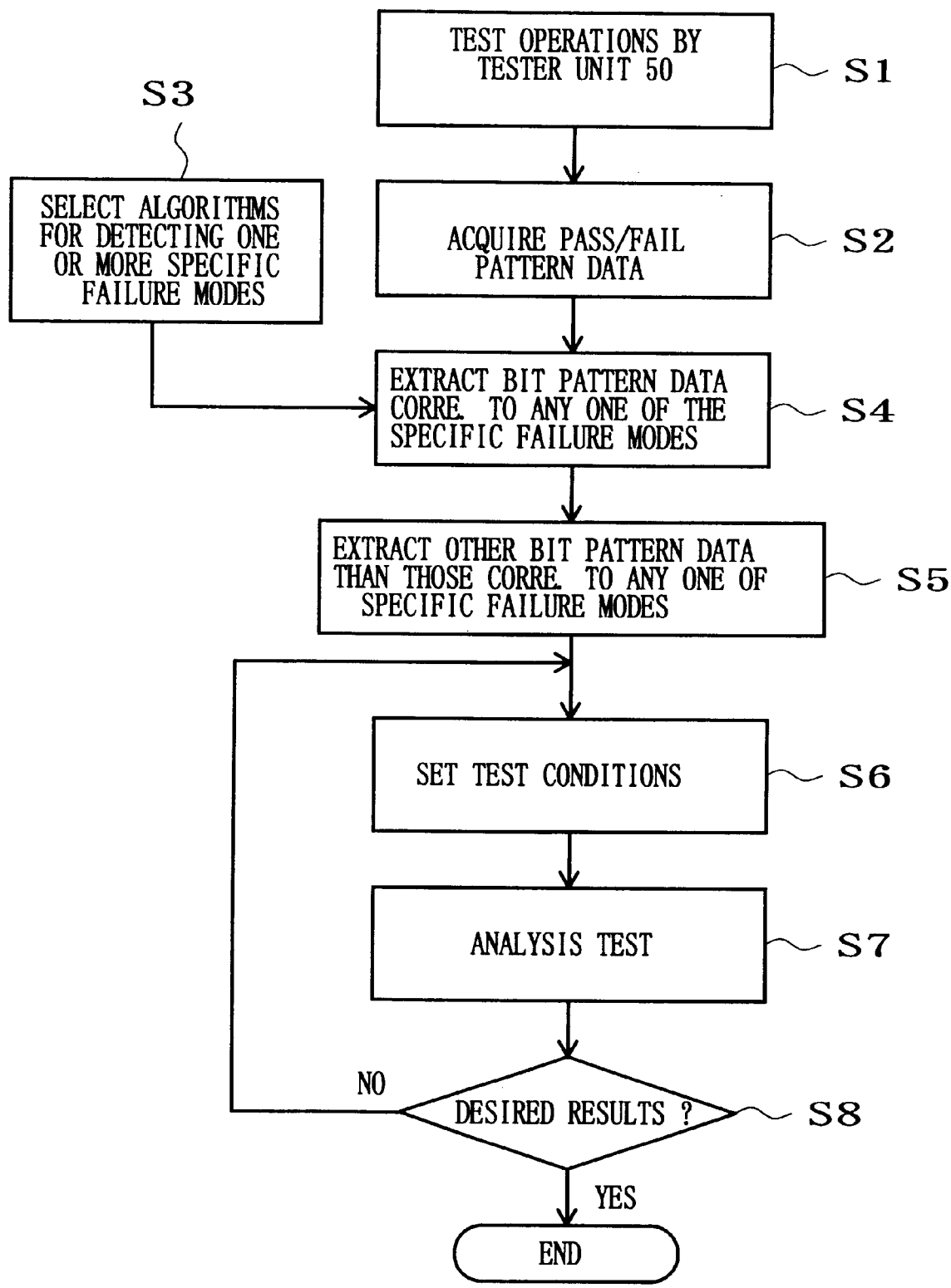
FIG. 3 is a flow chart showing an exemplary sequence of operations performed in the defect analysis test.

FIG. 3 is a flow chart showing an exemplary sequence of operations performed in the defect analysis test according to the embodiment of the present invention. First, at step S1, a set of predetermined pass/fail test operations is performed by the tester unit 50. At next step S2, pass/fail pattern data resultant from the pass/fail test operations are acquired from the tester unit 50 and stored into the analysis data memory section 68. At step S3, algorithms are selected for detecting one or more specific failure modes. Note that the term "failure mode" as used herein refers to a unique failed-bit pattern or distribution that would appear when an IC device having some defect or deficiency is tested under given test conditions. Because it is known empirically that each defective IC exhibits a different or unique failed-bit distribution depending on a particular cause of the defect, the cause can be identified empirically by ascertaining which of the failure modes the failed-bit distribution corresponds to. Examples of the failure mode includes a "single-bit failure" mode where there is no other failed bits immediately before and after a particular failed bit in question, a "pair-bit failure" mode where there are two failed bits in succession, and a "line failure" mode where there are three or more failed bits in succession due to a failure of a data or word line.

Then, at step S4 following step S2, bit pattern data (pass/fail pattern data FAIL) corresponding to any one of the specific failure modes are extracted from the analysis data memory section 68. At next step S5, other bit pattern data (pass/fail pattern data FAIL) than those corresponding to any one of the specific failure modes are extracted from the analysis data memory section 68. After that, at step S6, various test conditions are set for the bit pattern data (pass/fail pattern data FAIL) corresponding to the specific failure mode, such as a range of the analysis test, test pattern data, input level and data and output determining condition. At next step S7, the defect analysis test is carried out in accordance with the test conditions set at the preceding step. Then, from results of the performed defect analysis test, step S8 determines whether or not there has been an increase or decrease, within the test range, in the number of the failed bits from the last-detected failed bits and whether or not the results match the specific failure mode. If desired results have been obtained as determined at step S8 (YES determination), the defect analysis test is terminated, while if desired results have not been obtained (NO determination), execution of the defect analysis test is continued after setting new analysis test conditions.

In summary, the present invention having been described so far achieves the benefits that it can acquire information necessary for analyzing a defect in an IC during a test (curability determining analysis test) on the mass production line and thereby can effectively analyze a specific cause of a detected defect.

What is claimed is:

1. An IC testing apparatus comprising:
   a main tester unit that tests an IC device for presence of a defect for each of a plurality of addresses thereof under predetermined test conditions and stores test results for individual ones of the addresses into a first memory;
   a curing analysis processing section that cures each of the addresses of the IC device determined as defective on the basis of the test results for the individual addresses stored in said first memory; and
   a defect analysis section that acquires, from said main tester unit, the test results for the individual addresses along with test condition data indicative of said predetermined test conditions to store the test results, the individual addresses, and the test condition data into a second memory, and analyzes a specific cause of a defect in the IC device on the basis of the test results for the individual addresses and the test condition data stored in said second memory.

2. An IC testing apparatus as recited in claim 1 wherein the IC device has an extra address space, and wherein said curing analysis processing section rearranges an address logic of the IC device to replace a physical space of each of the addresses determined as defective with the extra address space and thereby places each of the defective addresses in a usable condition.

3. An IC testing apparatus as recited in claim 1 wherein the test condition data and the test results of a plurality of the IC devices are accumulated into said second memory, and wherein said defect analysis section analyzes a defect in a particular one of the IC devices on the basis of the test results, stored in said second memory, of the IC devices produced from a same semiconductor wafer.

4. An IC testing apparatus as recited in claim 1 wherein said main tester unit performs a test sequence including:
   a step of designating write addresses on the IC device and writing test pattern data at the designated write addresses;
   a step of designating read addresses on the IC device and reading out data from the designated read addresses; and
   a step of comparing the data read out from the read addresses and predetermined expected data, and
   wherein said main tester unit stores into said second memory results of said test sequence performed thereby.

5. An IC testing method comprising:
   a first step of, at a particular stage of an IC device production process, testing an IC device for presence of a defect for each of a plurality of addresses thereof under predetermined test conditions and storing test results for individual ones of the addresses into a first memory;
   a second step of curing each of the addresses of the IC device determined as defective on the basis of the test results for the individual addresses stored in said first memory;
   a third step of, in response to testing of the IC device by said first step, acquiring the test results for the individual addresses along with test condition data indicative of the predetermined test conditions to store the test results and the test condition data into a second memory; and
   a fourth step of analyzing a specific cause of a defect in the IC device on the basis of the test results for the individual addresses and the test condition data stored in said second memory, in parallel with operations of said first and second steps.

6. An IC testing method as recited in claim 5 wherein the test condition data and the test results of a plurality of the IC devices are accumulated into said second memory, and wherein said fourth step analyzes a defect in a particular one of the IC devices on the basis of the test results, stored in said second memory, of the IC devices produced from a same semiconductor wafer.

7. A machine-readable recording medium containing a group of instructions of a program executable by a computer, said program comprising:
   a first step of testing an IC device for presence of a defect for each of a plurality of addresses thereof under predetermined test conditions and storing test results for individual ones of the addresses into a first memory;
   a second step of curing each of the addresses of the IC device determined as defective on the basis of the test results for the individual addresses stored in said first memory;
   a third step of, in response to testing of the IC device by said first step, acquiring the test results for the individual addresses along with test condition data indicative of the predetermined test conditions to store the test results and the test condition data into a second memory, said second memory being capable of storing therein the test condition data and the test results of a plurality of the IC devices so that a specific cause of a defect in the IC device is analyzed on the basis of stored contents of said second memory.

8. A machine-readable recording medium as recited in claim 7 wherein said program further comprises:
   a fourth step of analyzing a specific cause of a defect in the IC device on the basis of the test results for the individual addresses and the test condition data stored in said second memory, in parallel with operations of said first and second steps.

* * * * *